United States Patent [19]

Angelotti

[11] Patent Number: 5,757,820
[45] Date of Patent: May 26, 1998

[54] METHOD FOR TESTING INTERCONNECTIONS BETWEEN INTEGRATED CIRCUITS USING A DYNAMICALLY GENERATED INTERCONNECT TOPOLOGY MODEL

[75] Inventor: Frank William Angelotti, Rochester, Minn.

[73] Assignee: International Business Machines Corporation, Armonk, N.Y.

[21] Appl. No.: 785,713

[22] Filed: Jan. 17, 1997

[51] Int. Cl.$^6$ .................................... G06F 11/00
[52] U.S. Cl. .................................... 371/27.1
[58] Field of Search .................... 371/27.1, 25.1, 371/24, 22.6, 22.8; 395/183.06; 324/158 R

[56] References Cited

U.S. PATENT DOCUMENTS

| | | | |
|---|---|---|---|
| 4,817,093 | 3/1989 | Jacobs et al. | 371/25 |
| 5,206,862 | 4/1993 | Chandra et al. | 371/27 |
| 5,254,942 | 10/1993 | D'Souza et al. | 324/158 R |
| 5,282,271 | 1/1994 | Hsieh et al. | 395/275 |
| 5,396,170 | 3/1995 | D'Souza et al. | 324/158.1 |
| 5,410,551 | 4/1995 | Edwards et al. | 371/25.1 |
| 5,475,694 | 12/1995 | Ivanov et al. | 371/22.4 |

*Primary Examiner*—Vincent P. Canney
*Attorney, Agent, or Firm*—Derek P. Martin; Martin & Associates, LLP

[57] ABSTRACT

Methods for testing interconnections on an electronic assembly include the steps of dynamically generating an interconnect topology model from one system, generating test patterns to test the interconnections, applying the test patterns to the boundary scan cells of the system under test to test the interconnections, and determining whether the interconnections match the interconnect topology model. The invention thus dynamically generates an interconnect topology model from a known working system, rather than deriving the interconnect topology model from design data that describes all the interconnections on an electronic assembly.

11 Claims, 11 Drawing Sheets

330

| Boundary Scan Cell | Cell Label |
|---|---|
| Cell A | 0 |
| Cell B | 1 |
| Cell C | 2 |
| Cell D | 3 |
| Cell E | 4 |
| Cell F | 1 |
| Cell G | 2 |
| Cell H | 5 |
| Cell I | 5 |
| Cell J | 2 |
| Cell K | 3 |
| Cell L | 6 |

FIG. 6

FROM STEP 2A
OF FIG. 7

3B) Generate Boundary Scan Input Patterns So Only the Selected Cell Drives Logic Zero. All Other Cells that Must Drive are Configured to Drive Logic One.

4B) Apply Patterns Generated in Step 3B to SUT

5B) Let Set Z = All Receiver Cells that Received a Logic Zero in Step 4B

6B) Generate Boundary Scan Input Patterns so Only the Selected Cell Drives a Logic One. All Other Cells that Must Drive are Configured to Drive Logic Zero 7B) Apply Patterns Generated in Step 6B to SUT 8B) Let Set O = All Receiver Cells that Received a Logic One in Step 7B

TO STEP 9
OF FIG. 8

METHOD FOR TESTING INTERCONNECTIONS BETWEEN INTEGRATED CIRCUITS USING A DYNAMICALLY GENERATED INTERCONNECT TOPOLOGY MODEL

BACKGROUND OF THE INVENTION

1. Technical Field

This invention generally relates to the testing of integrated circuits, and more specifically relates to a method for testing interconnections between integrated circuits.

2. Background Art

The proliferation of modern electronics into our everyday life is due in large part to the existence, functionality and relatively low cost of advanced integrated circuits. As technology moves ahead, the sophistication of electronic systems increases. An important aspect of manufacturing an advanced electronic system is the ability to thoroughly test the components and subassemblies in the system. Many semiconductor manufacturers have provided various built-in self-test (BIST) circuits on-chip to help to test the functionality of individual integrated circuits located on the chip. The testability of semiconductors was enhanced with the development of boundary-scan testing, as disclosed in IEEE Standard 1149.1 "Standard Test Access Port and Boundary Scan Architecture." Boundary scan testing allows an integrated circuit to be tested by placing shift registers between functional circuitry and input/output (I/O) pins when the device is placed in test mode. Test data is typically serially scanned into the shift registers to drive certain inputs, clocks are applied, results are captured, and the resultant outputs are determined by shifting the data out of the registers. The serial shift register elements that make up the boundary scan circuitry is known as a scan chain, because test data may be shifted or "scanned" into or out of the daisy-chained boundary scan registers.

In addition to testing the circuitry on a particular integrated circuit, more recent efforts have also recognized the need to test the interconnections between integrated circuits on an electronic assembly. Testing an electronic assembly (such as a printed wiring board (PWB) or a system that contains multiple PWBs) is difficult using traditional testing techniques. With the increasing popularity of surface mount technology, feature sizes of printed wiring boards (PWBs) have decreased significantly, making it increasingly difficult for automatic test equipment to contact device pins. In addition, multi-chip module (MCM) technology is gaining widespread acceptance. Many connections within an MCM are not available for contact to an external tester. For these, and many other reasons, testing of electronic assemblies by use of the IEEE 1149.1 boundary scan standard has become very popular. The 1149.1 standard provides a standardized methodology for applying test patterns without the need for a test fixture to contact the functional pins of integrated circuits mounted on the PWB.

The boundary scan methodology of testing interconnections in an electronic assembly has gained great importance in recent years. FIG. 2 depicts the prior art boundary scan test method 200 when applied to testing interconnections between integrated circuits. This approach starts with design information 210 describing the system under test. This design information must include descriptions of the integrated circuit's boundary scan structure (such as a representation in Boundary Scan Description Language (BSDL)), and logical descriptions of the interconnect topology of all interconnect structures within the system under test (e.g.,

2

MCMs, PWBs, backplanes, connectors, cables, etc.). This information must be condensed (step 220) into a form that can be used to generate interconnect test patterns. This representation is known as an interconnect topology model 230. From interconnect topology model 230, well-known methods can be used to generate (step 240) appropriate test patterns 250, apply the patterns to the system under test (step 260), and analyze results 270 to flag any defects in the physical interconnect structure of the system under test. The problem with the prior art method 200 of FIG. 2 is that presently, no standard exists for representing the logical connections between integrated circuits in the system under test. The software that creates the interconnect topology model must be able to deal with proprietary design representations employed by whatever computer-aided design (CAD) systems were used in the design of the interconnect components in the system under test. This problem is especially significant in a large system where the interconnect components may have been designed by a variety of CAD systems each of which employs a different proprietary design representation. With a host of different components that may be represented with design data in a variety of different formats, generating from design information 210 a comprehensive interconnect topology model of all interconnections in a relatively complex electronic assembly (e.g., a computer system) requires considerable time by a highly skilled engineer.

The practicality of testing the interconnections in a relatively complex electronic assembly using prior art methods depends on whether an interconnect topology model derived from design data will represent a relatively large number of units being tested. If there are a large number of units that will have an identical configuration, the cost of developing an interconnect topology model from design data may be amortized over the number of systems that are tested, and the cost per unit becomes reasonable. However, in many manufacturing environments, the number of configurations is too great to justify creating an interconnect topology model for each and every possible configuration. For a typical computer system, there may be numerous options for the type of hard drive, video card, CD-ROM drive, network card, optional expansion cards, cables, connectors, and the like. There may be literally tens or hundreds of thousands of different possible configurations. Generating an interconnect topology model from design data for each of these possible configurations would be prohibitively expensive, particularly since many of these possible configurations may never be built. Even generating an interconnect topology model for each type of system actually built still requires hundreds or possibly thousands of different interconnect topology models, which is still an unreasonably expensive solution. As a result, many companies are forced to construct interconnect topology models for their most popular system configurations, and to use more incomplete or more expensive testing methods to test other configurations.

In addition to the problems discussed above, there is currently no economical way to construct an interconnect topology model for a configuration that corresponds to only a few units. This would be very helpful in the development of system prototypes during the design and development phase of a new system. Ofttimes, when a prototype is built, long periods of time are spent to determine if the system was built to the proper specifications. In particular, the interconnections are often manually checked for continuity to assure the hardware is correct. This type of testing is very inefficient and expensive compared to boundary scan testing. However, for the reasons discussed above, building an interconnect topology model for boundary scan testing a small number of electronic assemblies (such as a few prototypes) is an unreasonably expensive solution.

The prior art does not provide an economical solution for the general problem of testing the interconnections of an electronic assembly that may have a large number of different configurations. In addition, prior art methods for testing the interconnections on an electronic assembly such as a prototype are prohibitively expensive. Without a method for simplifying testing of interconnections between integrated circuits on an electronic assembly, either the assembly will not be efficiently tested, or the expense and complexity of the test configuration will be excessive.

DISCLOSURE OF INVENTION

According to the present invention, methods for testing interconnections on an electronic assembly include the steps of dynamically generating an interconnect topology model from one system, generating test patterns to test the interconnections, applying the test patterns to the boundary scan cells of the system under test to test the interconnections, and determining whether the interconnections match the interconnect topology model. The invention thus dynamically generates an interconnect topology model from a known working system, rather than deriving the interconnect topology model from design data that describes all the interconnections on an electronic assembly.

The foregoing and other features and advantages of the invention will be apparent from the following more particular description of preferred embodiments of the invention, as illustrated in the accompanying drawings.

BRIEF DESCRIPTION OF DRAWINGS

The preferred embodiments of the present invention will hereinafter be described in conjunction with the appended drawings, where like designations denote like elements, and:

FIG. 6 is a table illustrating one possible interconnect topology model for the electronic assembly of FIG. 5 in accordance with a first embodiment of the present invention;

FIGS. 7–9 contain portions of a flow diagram of the steps performed in the method in accordance with the first embodiment;

FIG. 10 is a diagram showing the results of performing the splitting steps of the second embodiment.

BEST MODE FOR CARRYING OUT THE INVENTION

Overview—Boundary Scan Testing

Understanding the present invention requires a basic knowledge of boundary scan testing techniques, discussed below. Those who are familiar with the concepts relating to boundary scan testing may prefer to proceed with the Detailed Description of the invention below.

Figure 1:
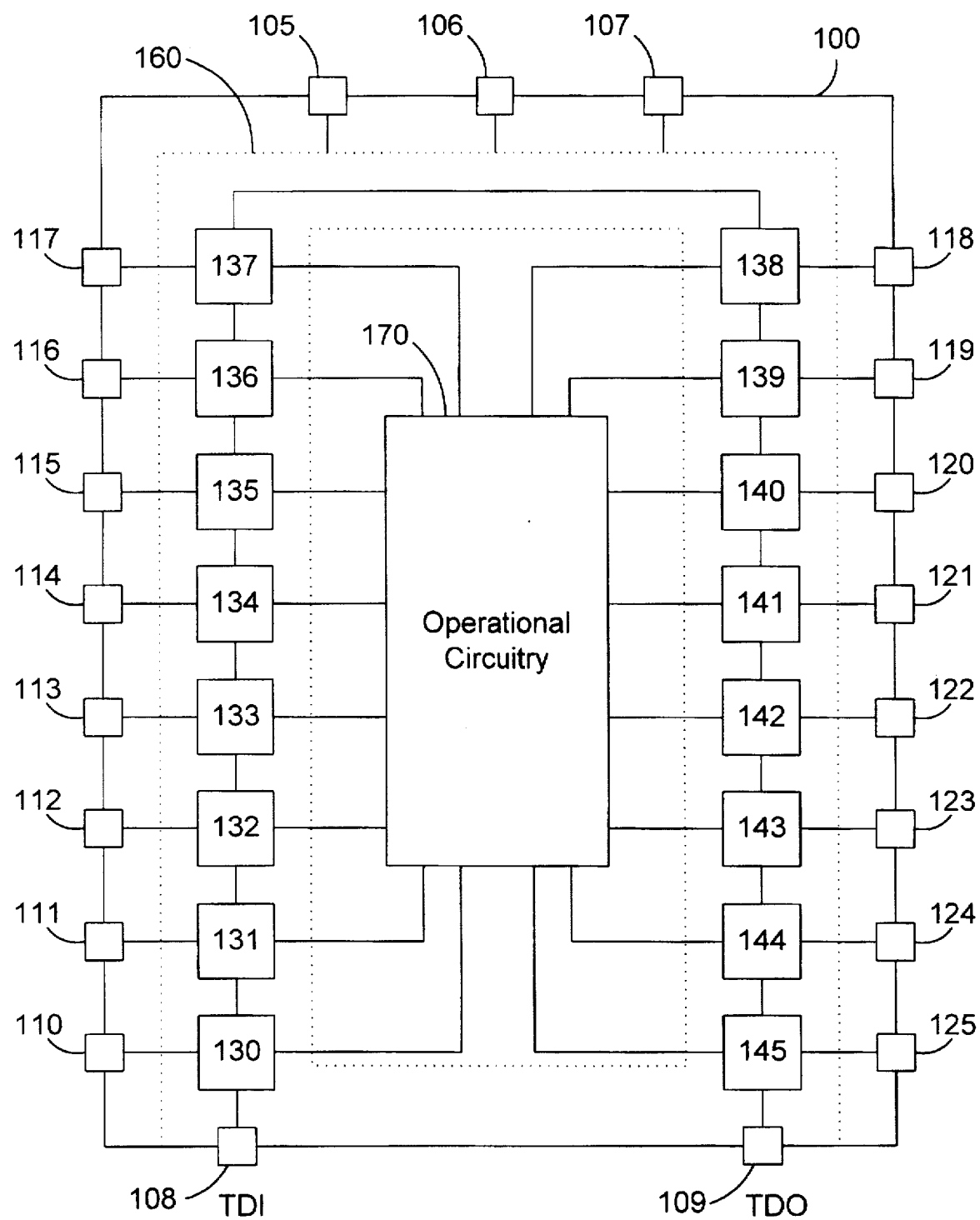
FIG. 1 is a block diagram of an on-chip test configuration that supports interconnect testing.

As discussed in the Background section, boundary-scan testing, as disclosed in IEEE Standard 1149.1, allows an integrated circuit to be tested by placing shift registers between functional circuitry and input/output (I/O) pins when the device is placed in test mode. Referring to FIG. 1, an integrated circuit 100 that has boundary scan circuitry includes operational circuitry 170, a plurality of input/output (I/O) pins (e.g., 105–125), and a plurality of boundary scan cells (e.g., 130–145). Operational circuitry 170 is the circuitry that is active during normal operation of device 100. In a normal mode of operation, operational circuitry 170 is coupled to I/O pins 110–125. Only in test mode do boundary scan cells 130–145 become active.

The serial chain of boundary scan cells 130–145 is known as a scan chain 160, because test data may be shifted or "scanned" into or out of the daisy-chained boundary scan registers 130–145. Some I/O pins (e.g., 105–107) provide needed control inputs into the circuitry of scan chain 160, such as shift clock signals to load and empty the scan chain. In test mode, boundary scan cells 130–145 interrupt the signals to and from operational circuitry 170 that normally pass through to I/O pins 110–125. Boundary scan cells 130–145 typically include shift registers that allow test data to be shifted into the test data in (TDI) input (pin 108), and that allow test results to be shifted out on the test data out (TDO) output (pin 109). Test data is typically serially scanned into the TDI input (pin 108) of scan chain 160 to cause certain boundary scan cells to drive their respective pins. Clocks are then applied, results are captured, and the results are determined by shifting the data out of scan chain 160 at the TDO output (pin 109).

In addition to shift registers that are well known in the art, boundary scan cells 130–145 may also include additional logic to reduce the burden of testing interconnects between device 100 and one or more other devices. In fact, the concepts of the present invention apply to any boundary scan cell configuration that supports the method steps outlined herein. For the purposes of illustration, one specific configuration for boundary scan cell 130 is disclosed herein in FIG. 4, which includes register pairs that form a special type of shift register known as a shift register latch (SRL). Boundary scan cell 130 includes a data latch pair (SRL) 410 and 412; an enable latch pair (SRL) 420 and 422; a driver 430; a receiver 440; AND gate 460; inverter 462; OR gate 470; and multiplexers (MUXs) 480 and 490. Latches 410, 412, 420, and 422 contain test data that is shifted into device 100 via a Scan Data In input, which is coupled to the TDI input (pin 108). A clock signal Master Shift is provided to latch data present at the Scan Data In input into the L1 latches (410 and 420). A second clock signal Slave Shift is provided to latch data present on L1 outputs in the L2 latches (412 and 422). The Master and Slave shift clock signals could be derived from the IEEE 1149.1 standard TCK signal. Note that many other types of boundary scan cells may be used in accordance with the method of the present invention.

Figure 4:
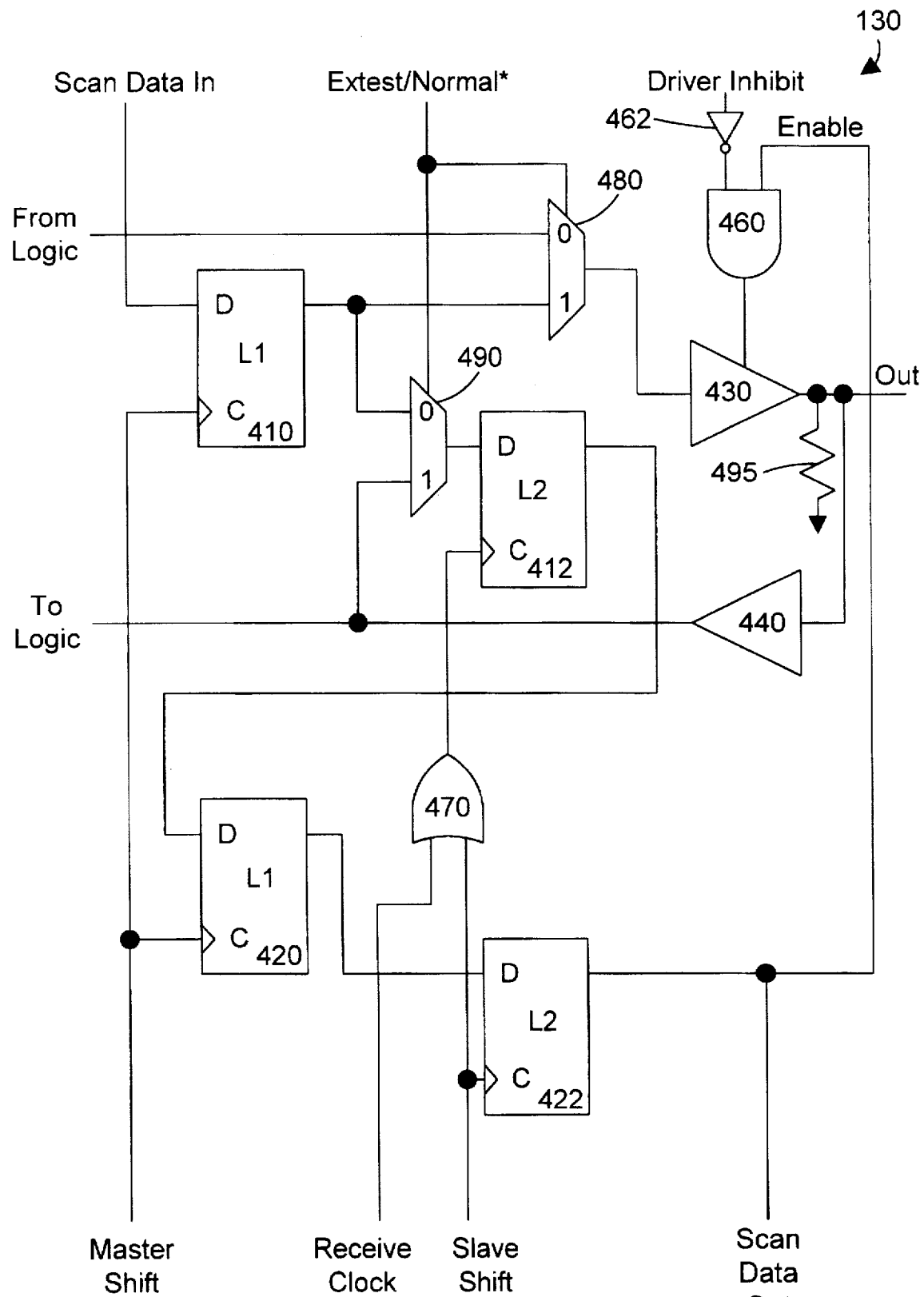
FIG. 4 is a schematic view of a suitable boundary scan cell that supports interconnect testing in accordance with the present invention.

Testing using the boundary scan cell of FIG. 4 is accomplished by first turning on the Driver Inhibit signal to put all interconnections in a high impedance state. Then, the Extest/

Normal* signal is driven low to configure boundary scan registers for serial scan. Next, test patterns are scanned in by toggling the nonoverlapping Master and Slave shift clocks in the proper sequence. Note that scan in operations are always initiated by a Master Shift clock and are ended on a Slave Shift clock so the master (L1) and slave (L2) latches always contain identical data at the end of the test pattern scan in phase. The test generation method views the master/slave pairs as single memory elements. To apply the test pattern, the Driver Inhibit signal is driven low, and the Extest/Normal* signal is driven high. After an appropriate delay for signal values to propagate, the Receive Clock is toggled, capturing the net value into the slave data latches (e.g., 412) of all boundary scan elements. Finally, test results are scanned out using the same sequence of clock pulses that was used to scan the test patterns in.

Latch 410 drives the output OUT to a desired logic level when enable latch 422 enables the OUT output by driving an appropriate logic level on the Enable input to AND gate 460. Each boundary scan cell 130 in the electronic assembly preferably has its own dedicated data and enable latches to allow each boundary scan cell to drive its output independently of the other boundary scan cells. However, as discussed in more detail below, the method of the first embodiment works even if boundary scan cells share enable latches.

DETAILED DESCRIPTION

Figure 2:
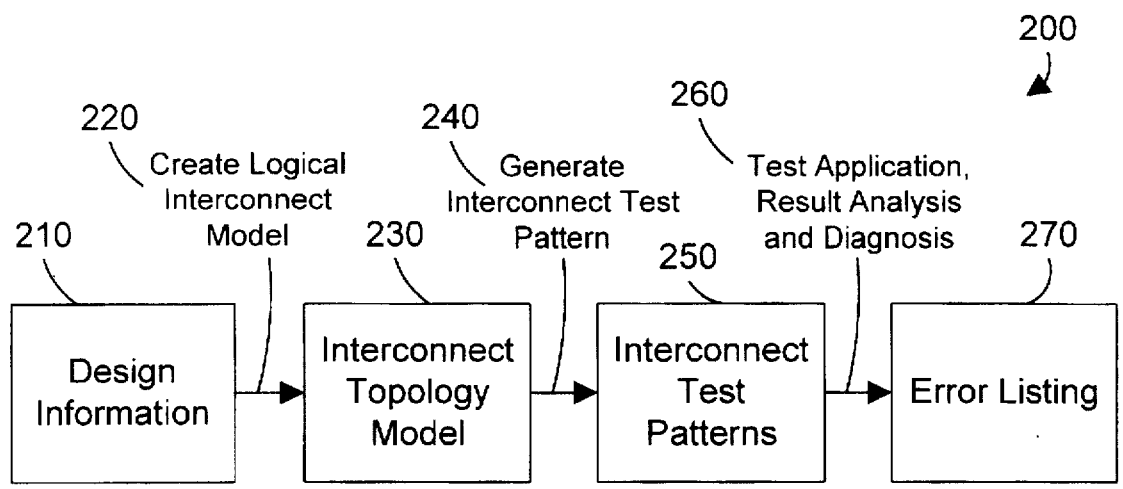
FIG. 2 is a block diagram of a known method for testing interconnections on an electronic assembly using boundary scan techniques.
Figure 3:
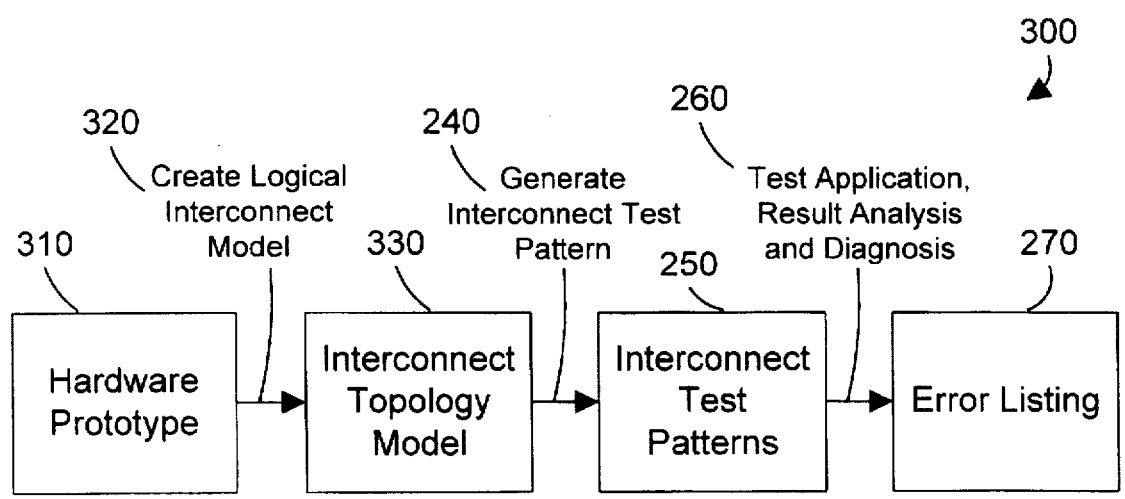
FIG. 3 is a block diagram of the method for testing interconnections on an electronic assembly in accordance with the present invention.

An interconnect testing method in accordance with the present invention allows the testing of interconnects between integrated circuits by dynamically generating an interconnect topology model from a working prototype rather than from design data, and by generating and applying appropriate test patterns based on the generated interconnect topology model. Referring to FIG. 3, method 300 in accordance with preferred embodiments of the present invention starts with a hardware prototype or other working hardware 310, and dynamically generates (step 320) an interconnect topology model 330. The resultant interconnect topology model 330 may contain the same information as interconnect topology model 230 of the prior art method of FIG. 2, or may contain more or less information according to specific testing needs. Note that steps 240 and 260 and representations 250 and 270 may be identical to the same elements in method 200 of FIG. 2. Two embodiments of method 300 are disclosed in greater detail below.

Figure 5:
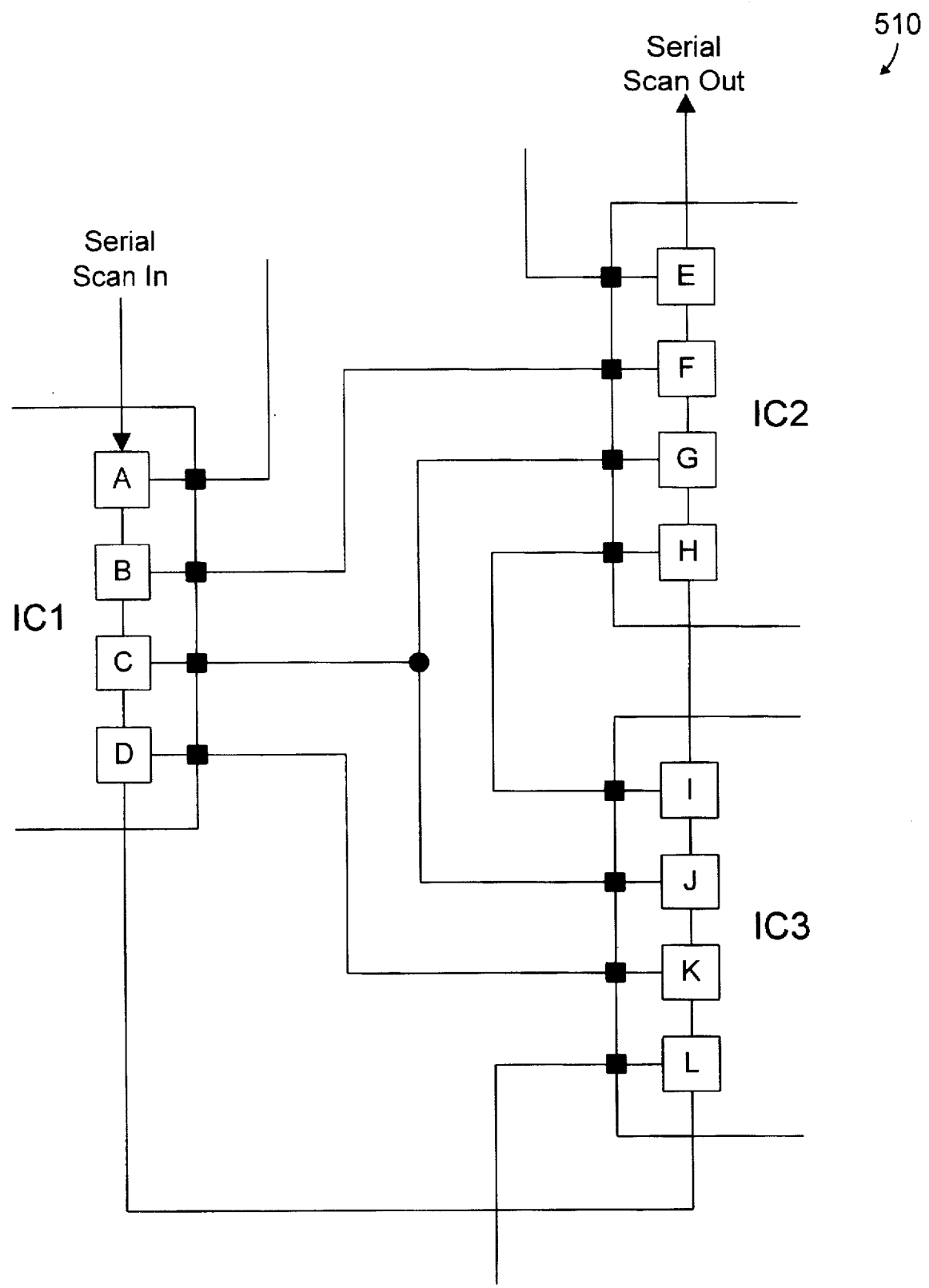
FIG. 5 is a schematic view of an example electronic assembly that contains three integrated circuits.

By using method 300 in accordance with the present invention, simplified testing of interconnects between multiple integrated circuits is now possible. Referring to FIG. 5, an electronic assembly 510 (e.g., a circuit board) is provided with three integrated circuits IC1, IC2 and IC3. Integrated circuits IC1–IC3 each have circuitry that support a test configuration similar to device 100 of FIG. 1. Each integrated circuit IC1–IC3 includes a plurality of boundary scan cells.

The remainder of this specification describes how interconnects in the three-chip electronic assembly in FIG. 5 may be tested in accordance with the present invention. The interconnections shown in FIG. 5 may be implemented in a multi-chip module MCM substrate, via a PWB or perhaps via cable or other type of physical interconnect structure. For purposes of illustrating the invention, the interconnect topology model is an assignment of labels to boundary scan cells such that: 1) if two or more boundary scan cells share a particular label assignment, those cells are connected by a net in the system; and 2) if two or more cells are connected by a net in the system, then those cells share a particular label assignment. The interconnect topology model represents the logical interconnect structure of the system under test. When the information in the interconnect topology model is combined with information regarding the structure of the boundary scan cells in the integrated circuits in the system (such as a BSDL representation), interconnect test patterns 250 (i.e., test vectors) may be generated via well known methods.

Methods in accordance with the present invention dynamically generate (step 320) the interconnect topology model 330 from a hardware prototype or working system of the system under test. The methods disclosed herein assume that undriven nets in the system will unpredictably but consistently float to either a logic zero or logic one, and will return the same value each time the net is undriven. In many manufacturing processes, it is impossible to predict whether a given net will float to a zero or a one, but once one level has been observed on a particular undriven net, the net can be relied on to float to the same level on subsequent tests. If the particular technology and process does not guarantee this result, the outputs of all boundary scan cells may include circuit elements to pull-up or pull-down the output to a known state when undriven. An example of a suitable pull-down circuit is shown by a pull-down resistor 495 in FIG. 4 tied to the OUT signal.

Now consider the network of FIG. 5 and suppose the system consists of tristate nets with boundary scan cells similar to that depicted in FIG. 4. We can set up and apply a boundary scan test pattern where only a single cell in the system drives its net. Suppose cell B is chosen to drive, and a test pattern is determined that will cause cell B to drive a zero. Then a zero will be received on cell F on IC2. Let Z be the set of all cells that received a zero in this test. Z must include F because its net was driven to zero by cell B. However Z may well include other undriven cells that have floated to zero. Suppose Z={A,F,G,J,L}. Next, we run a test pattern where cell B drives a one and let O be the set of all cells that receive a one. Now O={C,D,E,F,H,I,K}. O must contain F because F was driven to one. O must also contain all the cells connected to undriven nets that did not appear in Z because these are the nets that float to one. The only cells that can be in both O and Z are those cells that were connected to the net driven by cell B. The intersection of O and Z is {F}. Thus B and F possess the same label in the interconnect topology model. Now we can pick any unlabeled cell in the topology model and repeat the above procedure to determine all the other cells that should have the same label. We repeat the process until all nets and boundary scan cells have been assigned a label.

Figure 7:
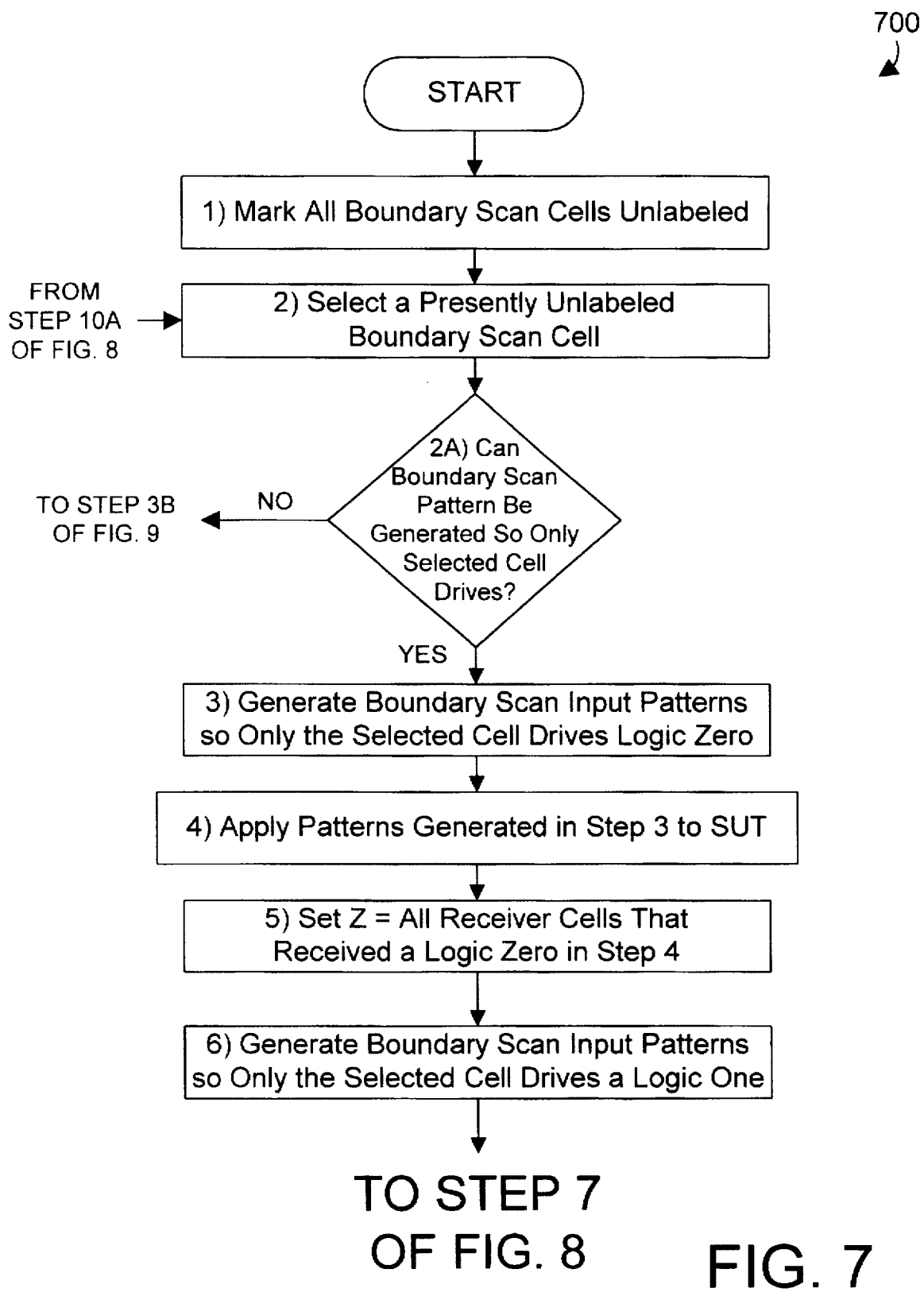
Figure 8:
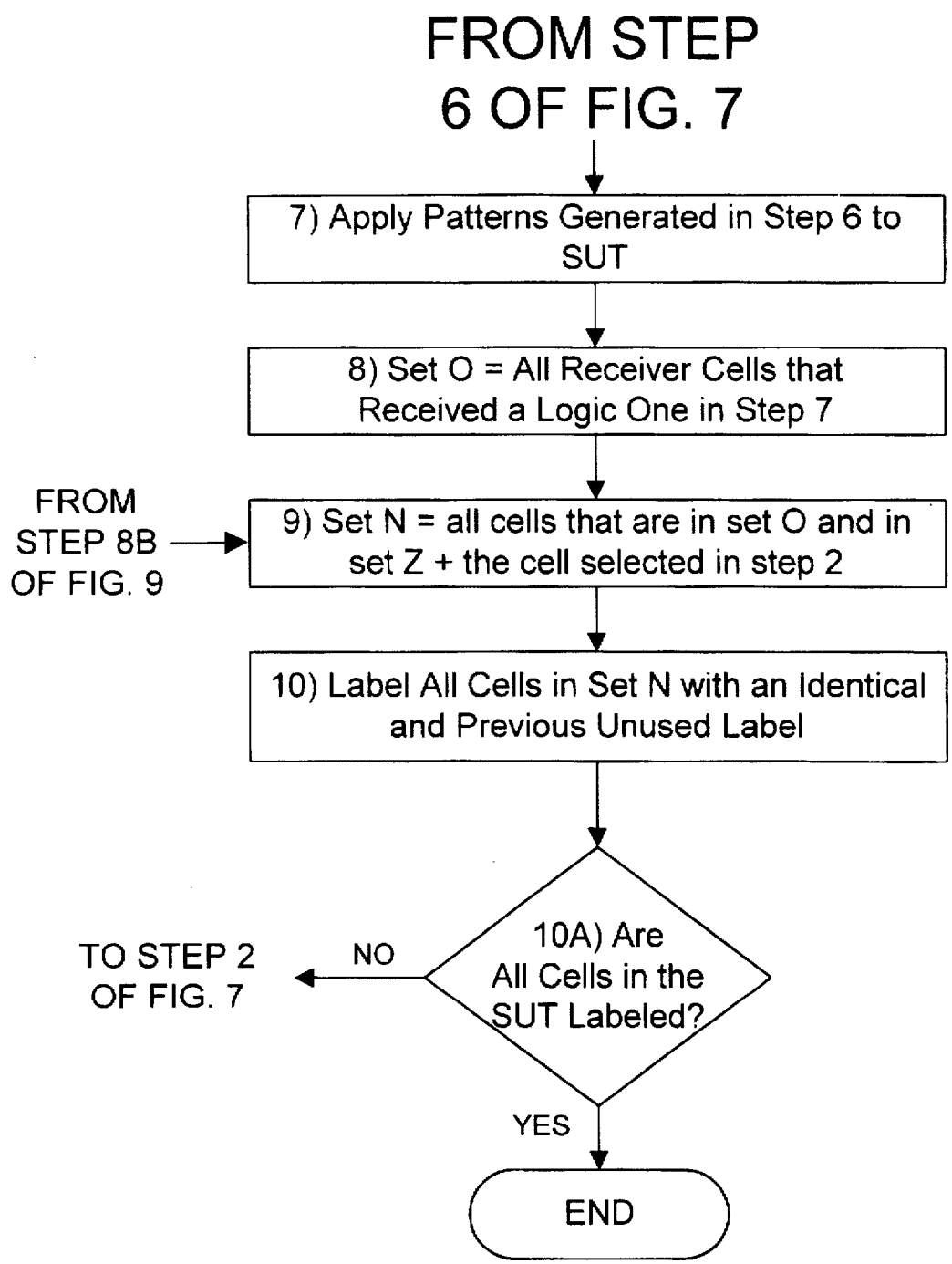

The method 700 in accordance with the first embodiment may be illustrated with reference to the flow diagram of FIGS. 7–9. Note that the term "system under test" is abbreviated as SUT in the figures. First we mark all boundary scan cells unlabeled (step 1). Next we select any unlabeled cell (step 2). Assume that cell A is selected. Assuming all nets in this example are tristate nets controlled by individual enable cells (e.g., each boundary scan cell is like cell 130 of FIG. 4), it will always be possible to create a pattern where only the selected cell drives (step 2A=YES). Next, a boundary scan input pattern (i.e., test vector) is generated (step 3) and applied to the system under test (step 4). Set Z is then assigned all receiver cells that received a logic zero (step 5). For the purposes of this example, we assume that nets C, D, G, I, and K float low when undriven, and that nets B, E, F, H, J, and L float high when undriven. Thus, for step 5, Z={C,D,G,I,K}. Next a pattern that drives a one from cell A is generated (step 6) and applied (step 7). Set O is then assigned all receiver cells that received a logic one (step 8). For this example, O={B,E,F,J,J,L}. Set N is then assigned to the cell being driven and to the intersection of sets Z and O (step 9). The intersection of Z and O is empty, so the only member of set N is A. Cell A is assigned a unique label "0" (step 10). Not all cells have been labeled at this point (step 10A=NO), so we start another iteration. This time cell B is selected to drive. The drive zero test (steps 3–5) and drive one test (steps 6–8) are repeated with cell B driving. In this case the intersection of Z and O is {F} (step 9), so cells B and F are assigned the same unique label "1". This continues as depicted in FIG. 6 until all cells are labeled. Note that this method loops once for each net in the system. It is thus an O(N) method where N is the number of nets in the system. While this is very tractable, it is possible to create a more sophisticated method with better performance, as described below with reference to the second embodiment.

Steps 3B–8B of the first embodiment (FIG. 9) are executed if the boundary scan pattern can not be generated so that only the selected cell drives. These steps generalize the method 700 to cover situations where enable control is shared or cells are dedicated drivers or receivers. If multiple cells drive at once, the boundary scan input patterns are generated so that only the selected cell drives a logic zero, and the other driving cells drive a logic one (step 3B). The patterns are applied to the system under test (step 4B), and set Z is determined as before (step 5B). Next, the boundary scan input patterns are generated so that only the selected cell drives a logic one, and all other driven cells drive a logic zero (step 6B). The patterns are applied to the system under test (step 7B), and set O is determined as before (step 8B). Processing then continues with step 9 of FIG. 8. As these steps illustrate, if independent control of the cell to be driven is available, steps 3–8 are executed, which drive the selected cell initially low, then high, while monitoring the cells that potentially receive the signal. If independent control of the cell is not available, the cell is still driven to a zero, followed by a one, but the other cells that are also driven are driven to the opposite states of the selected cell. In this manner the method of the first embodiment may be used to test the interconnections in an electronic assembly even if the boundary scan cells share enable latches.

Consider the basic operation of the method of the first embodiment, which entails choosing a single cell and performing an experiment that determines what other cells are connected to the selected cell. The basic operation of the first embodiment can be generalized for a second embodiment to an operation in which a set of boundary scan cells is selected and an experiment is performed which determines all cells which are connected to any cells in the selected set. This can be accomplished as follows. Let P be a set of boundary scan cells. A boundary scan test pattern can be generated so that all the cells in P drive a logic zero and all other cells in the system under test are in non-driving mode. Let Z be the set on boundary scan cells that received a logical zero on application of this test pattern. Similarly the set O can be constructed by driving a logic one on all cells in P and noting the boundary scan cells which receive a logic one. Then the intersection of Z and O is the set of all cells in the system under test that are connected to any of the cells in P. Knowing all the cells that are connected to a cell in P also tells us that any cell in the system that is not in this set is not connected to any cell in P. This partitions the system into multiple independent parts that can be examined in parallel in future experiments. This partitioning scheme is the basis of the method in accordance with the second embodiment.

Now consider the extreme case of a system with B boundary scan cells all of which are connected to a single net. In this situation, the method of the first embodiment will determine that all cells have the same label in the interconnect topology model in a single loop iteration. This is the best possible performance any method could achieve on this problem. However consider the other extreme case where X boundary scan cells are completely disconnected. In this situation, the method of the first embodiment must probe each cell requiring X probe operations before it is complete. This performance can be vastly improved by the generalized probe technique of the second embodiment. Note that any probe of a set of cells in such a completely disconnected system under test will result in exactly the same set that was probed. This fact can be used to divide the network in half by probing approximately half the cells. The two halves will have no connections between them so they can be probed in parallel and further divided in half. This parallel subdivision process can continue until the system is completely divided into sets that represent the cells which share a common label in the interconnect topology model. In this case $\log_2 B$ subdivision operations are needed.

A method in accordance with the second embodiment will be described by first going through an example. This example is depicted in FIG. 10. First set $P_{01}$, the zeroth partition set, to be the set of all cells. Similarly set $R_{01}$, the zeroth result, to be the same set. Now choose the first partition set $P_{11}$ to be randomly chosen set of approximately $\lfloor p/2 \rfloor$ cells from $P_{01}$ where p is the number of cells in $P_{01}$. The brackets $\lfloor \rfloor$ denote that the floor value is taken, the smallest whole number less than or equal to the result. Here p=twelve so six cells are chosen. Let $P_{11}$={B,C,F,H,I,L}. There is only one partition set so that set is used to probe the system under test. Thus, $P=P_{11}$={B,C,F,H,LL}. $R_{11}$ is the resulting set of all cells that are connected to any cell in $P_{11}$. Because there are cells in $R_{01}$ that are not in $R_{11}$, we know that these cells are not connected to any cells in $R_{11}$. So we can surmise that $R_{12}=R_{01}-R_{11}$={A,D,E,K}. There is also enough information to surmise which probe set could have result set $R_{12}$. $R_{12}$ is completely independent of $R_{11}$. $R_{12}$ is a subset of $R_{01}$ so $R_{12}$ must be connected to some elements in $P_{01}$. Therefore we can surmise that $R_{12}$ is the result set of the set of elements in $P_{01}$ and not in $R_{11}$={B,C,F,H,I,L,G,J}. So we can infer $P_{12}=P_{01}-R_{11}$={A,D,E,K}. Since neither $P_{11}$ nor $P_{12}$ consist of a single cell, we cannot label any cells in this iteration. Now we start another iteration to undertake a further subdivision of our system under test. We split $P_{11}$ and $P_{12}$ in parallel by choosing an arbitrary subset of half the size of the original set. This leads to $P_{21}$={B,F,I} and $P_{22}$={E,K}. Since we know these sets are independent, we apply probe set P={B,F,I,E,K} to the system under test to obtain result R={B,F,I,E,K,H,D}. We can split this into two results sets $R_{21}$={B,F,I,H} and $R_{22}$={E,K,D} because $R_{21}$ must be a subset of $R_{11}$ and $R_{22}$ must be a subset of $R_{12}$. Now based on this second probe of the hardware we can surmise several other P/R pairings. We have $R_{23}=R_{11}-R_{21}$={C,L,G,J} and $R_{24}=R_{12}-R_{22}$={A}. To surmise the probe sets for these result sets we have $P_{23}=P_{11}-R_{21}$={C,L} and $P_{24}=P_{12}-R_{22}$={A}. Now we have divided the system under test into four independent pieces represented by $R_{21}-R_{24}$. Since the probe set for $R_{24}$ contains only a single cell, $R_{24}$ is the set of all cells that should share the same label and we are done with this set (as indicated by the check mark), so A gets a unique label in the interconnect topology model.

Now we start another iteration to further partition $P_{21}$, $P_{22}$, and $P_{23}$ by splitting them in parallel. Let $P_{31}$={I}, $P_{32}$={K} and $P_{33}$={C}. Apply the probe set P={I,K,C} to the system to obtain result set R={I,K,C,H,D,J,G}. This gets partitioned into result sets $R_{31}$={I,H}, $R_{32}$={K,D}, and $R_{33}=\{C,G,J\}$. Again we can surmise additional probe and result sets because we have split our three previous result sets. We have $R_{35}=R_{21}-R_{31}=\{B,F\}$; $R_{36}=R_{22}-R_{32}=\{E\}$; $R_{37}=R_{23}-R_{33}=\{L\}$; $P_{35}=P_{21}-R_{31}=\{B,F\}$; $P_{37}=P_{23}-R_{33}=\{L\}$; and $P_{36}=P_{22}-R_{32}=\{E\}$. Now we have several results that are generated by single element probe sets. We can label I,H,C,G,F,L,K,D and E and the only active group is $P_{35}$. The final step probes F and verifies that B,F share a label. This method is illustrated by the flow diagram of FIGS. 11 and 12. Note that judicious selection of labels results in the same interconnect topology model shown in FIG. 6 that resulted from the method of the first embodiment.

Figure 11:
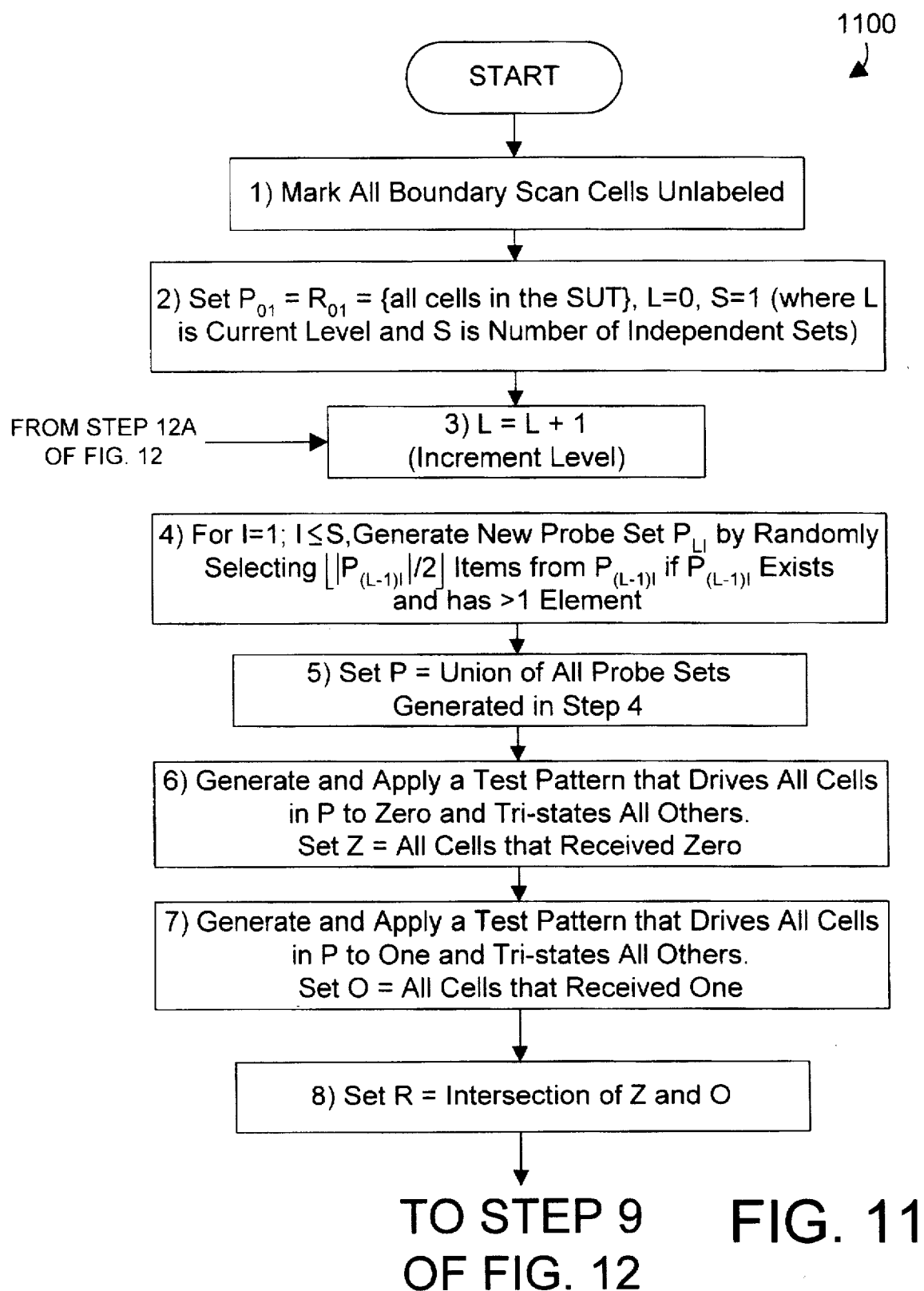
FIGS. 11 and 12 contain portions of a flow diagram of the steps performed in the method in accordance with the second embodiment.
Figure 12:
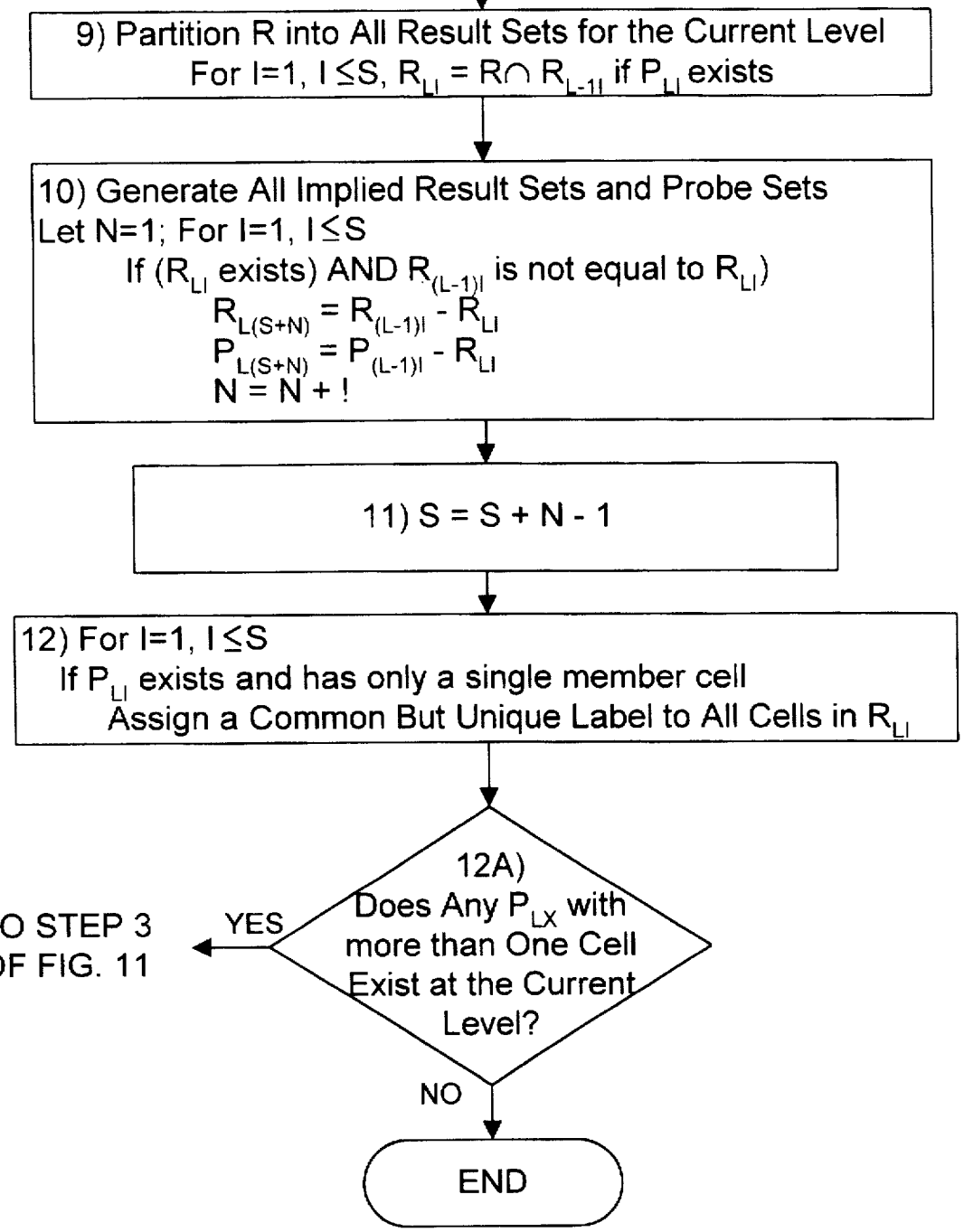

Referring to FIGS. 11 and 12, method 1100 in accordance with the second embodiment begins by marking all boundary scan cells as unlabeled (step 1). Next, $P_{01}$ and $R_{01}$ are set to include all boundary scan cells in the system under test. A variable L that represents the current level is initialized to zero, and a variable S that represents the number of independent sets is initialized to one (step 2). The next step increments the level L (step 3). In the next step (step 4), for I=1 and I≤S, generate a new probe set $P_{LI}$ by randomly selecting $\lfloor |P_{(L-1)I}|/2 \rfloor$ items from $P_{(L-1)I}$ if $P_{(L-1)I}$ exists and has >1 element. Set P is then assigned the union of all probe sets generated in step 4 (step 5). Step 6 then generates and applies a test pattern that drives all cells in P to zero, does not drive all others and stores the cells that received zero in set Z. In like manner, step 7 generates and applies a test pattern that drives all cells in P to one, does not drive all others and stores the cells that received a one in set O. Set R is then formed from the intersection of Z and O (step 8). The next step (step 9) then partitions R into all result sets for the current level. For I=1 and I≤S, $R_{LI}=R \cap R_{(L-1)I}$ if $P_{LI}$ exists. Next, all implied result sets and probe sets are derived (step 10). For I=1, I≤S, if ($R_{LI}$ exists) AND ($R_{(L-1)I}$ is not equal to $R_{LI}$), $R_{L(S+N)}=R_{(L-1)I}-R_{LI}$; $P_{L(S+N)}=P_{(L-1)I}-R_{LI}$; and N=N+1. Next, S is incremented by the appropriate amount (step 11). The final step assigns labels where possible (step 12). For I=1, I≤S, if $P_{LI}$ exists and has only a single member cell, assign a common but unique label to all cells in $R_{LI}$. Next, step 12A determines if there are any probe sets $P_{LX}$ with more than one cell at the current level. If so, the method iterates back to step 3. If not, the method is complete, and the desired interconnect topology model has been generated.

The methods of the present invention allow determining the interconnect topology model for an electronic assembly without having to derive this model from design data. In the preferred mode of operation, a prototype or other working system will be tested thoroughly to assure it is fully functional. The interconnect topology model for this system is then dynamically generated, and becomes the golden model for subsequent testing of other systems. However, it is also within the scope of the present invention to generate an interconnect topology model for any system, whether known good or of unknown status. The methods of the invention detect differences between the interconnect topology model of a first system (model) and a second system (system under test). Thus, these methods may be used to determine differences in interconnect topology from one configuration to the next. In addition, the interconnect topology model for an electronic assembly with permanent storage (such as a computer system with a hard disk drive) may be stored in the permanent storage for later diagnostic field testing. If the computer system needs service, a technician could use the method disclosed herein to determine whether the current configuration matches the configuration of the system when it was originally built. The system could thus be used to detect field failures such as bent pins, bad cables, burnt-out drivers, etc. In this manner, if short or open circuits develop over time, the disclosed methods provide a way to quickly let the electronic assembly dynamically determine itself whether its current configuration matches an earlier configuration, and to pinpoint any differences.

While the invention has been particularly shown and described with reference to preferred embodiments thereof, it will be understood by those skilled in the art that various changes in form and details may be made therein without departing from the spirit and scope of the invention.

I claim:

1. A method for testing a plurality of interconnections between a plurality of integrated circuits on a first electronic assembly, the method comprising the steps of:

dynamically generating an interconnect topology model from at least one electronic assembly;

generating a plurality of test patterns from the interconnect topology model to test the plurality of interconnections;

applying the plurality of test patterns to the boundary scan cells of the first electronic assembly to test the plurality of interconnections between the plurality of integrated circuits; and determining whether the plurality of interconnections match the interconnect topology model based on the results of applying the plurality of test patterns.

2. The method of claim 1 wherein the step of dynamically generating an interconnect topology model comprises the steps of:

(A) providing the electronic assembly, the electronic assembly including a plurality of integrated circuits, each integrated circuit including a plurality of boundary scan cells arranged in at least one scan chain, the electronic assembly including a plurality of interconnections between the plurality of boundary scan cells in the plurality of integrated circuit devices;

(B) selecting at least one of the plurality of boundary scan cells to drive at least one logic signal;

(C) determining which (if any) of the plurality of boundary scan cells receive the at least one logic signal;

(D) labeling the driving boundary scan cell and all receiving boundary scan cells with the same unique label; and (E) repeating steps (B) through (D) until all boundary scan cells are labeled.

3. The method of claim 2 wherein the steps of B and C comprise the steps of:

selecting at least one of the plurality of boundary scan cells to drive a logic zero;

determining a first set of the plurality of boundary scan cells that return a result pattern indicating the logic zero;

selecting at least one of the plurality of boundary scan cells to drive a logic one;

determining a second set of the plurality of boundary scan cells that return a result pattern indicating the logic one;

determining which (if any) of the plurality of boundary scan cells are in the first set and the second set.

4. The method of claim 1 wherein the step of dynamically generating an interconnect topology model comprises the steps of:

(A) providing the electronic assembly, the electronic assembly including a plurality of integrated circuits, each integrated circuit including a plurality of boundary scan cells arranged in at least one scan chain, the electronic assembly including a plurality of interconnections between the plurality of boundary scan cells in the plurality of integrated circuit devices;

(B) determining a probe set by selecting at least one of the plurality of boundary scan cells to drive at least one logic signal;

(C) applying the probe set to the electronic assembly;

(D) determining a result set corresponding to the probe set, the result set comprising the boundary scan cells (if any) that receive the at least one logic signal;

(E) determining implied result and probe sets surmised from the probe set and result set of steps B and D and from the probe set and result set of any previous iteration;

(F) dividing the probe step of step (B) into disjoint subsets based on the probe and result sets in steps (D) and (E);

(F) repeating steps (B) through (F) in parallel on all subsets of step (E) until all probe sets consist of a single boundary scan cell;

(G) labeling the boundary scan cells in each result set that corresponds to a single element probe set with the same unique label.

5. The method of claim 4 wherein the steps of (B) through (D) comprise the steps of:

(1) applying a first test pattern that drives all of the plurality of boundary scan cells in the probe set to a logic zero;

(2) determining from a first result set which of the plurality of boundary scan cells receive the logic zero;

(3) applying a second test pattern that drives all of the plurality of boundary scan cells in the probe set to a logic one;

(4) determining from a second result set which of the plurality of boundary scan cells receive the logic one;

(5) deriving the result set of the probe set of step one by intersecting the first result set and the second result set.

6. A method for dynamically generating an interconnect topology model for an electronic assembly, the method including the steps of:

(A) providing the electronic assembly, the electronic assembly including a plurality of integrated circuits, each integrated circuit including a plurality of boundary scan cells arranged in at least one scan chain, the electronic assembly including a plurality of interconnections between the plurality of boundary scan cells in the plurality of integrated circuit devices;

(B) selecting at least one of the plurality of boundary scan cells to drive at least one logic signal;

(C) determining which (if any) of the plurality of boundary scan cells receive the at least one logic signal;

(D) labeling the driving boundary scan cell and all receiving boundary scan cells with the same unique label; and (E) repeating steps (B) through (D) until all boundary scan cells are labeled.

7. The method of claim 6 wherein step B is performed by shifting at least one test pattern into the at least one scan chain.

8. The method of claim 6 wherein step C is performed by shifting at least one result pattern out of the at least one scan chain.

9. A method for testing a first plurality of interconnections between a first plurality of integrated circuit devices on a first electronic assembly, the method comprising the steps of:

(A) providing a model electronic assembly, the model electronic assembly including a second plurality of integrated circuits, each of the second plurality of integrated circuit including a plurality of boundary scan cells arranged in at least one scan chain, the model electronic assembly including a second plurality of interconnections between the plurality of boundary scan cells in the second plurality of integrated circuit devices;

(B) selecting at least one of the plurality of boundary scan cells to drive at least one logic signal;

(C) determining which (if any) of the plurality of boundary scan cells receive the at least one logic signal;

(D) labeling the driving boundary scan cell and all receiving boundary scan cells with the same unique label;

(E) repeating steps (B) through (D) until all boundary scan cells are assigned a label;

(F) determining from the labels assigned to the boundary scan cells the interconnect topology model for the model electronic assembly;

(G) generating a plurality of test patterns for the at least one scan chain to test the first plurality of interconnections in the first electronic assembly;

(H) generating a plurality of expected result patterns that correspond to the plurality of test patterns;

(I) providing the first electronic assembly;

(J) applying the plurality of test patterns to the first electronic assembly;

(K) reading a plurality of result patterns that correspond with the plurality of test patterns; and (L) comparing the plurality of result patterns with the plurality of expected result patterns.

10. The method of claim 9 further comprising the step of indicating that the interconnections for the first electronic assembly are different from the model electronic assembly if the plurality of result patterns do not match the plurality of expected result patterns.

11. The method of claim 10 further comprising the step of identifying which of the plurality of interconnections are different from the plurality of test patterns that returned result patterns that do not match the plurality of expected result patterns.

* * * * *